United States Patent [19]

Marinace

[11] 3,802,969

[45] Apr. 9, 1974

[54] SEMICONDUCTOR DEVICES AND FABRICATING TECHNIQUES

[75] Inventor: John C. Marinace, Yorktown Heights, N.Y.

[73] Assignee: International Business Machines Corporation, Armonk, N.Y.

[22] Filed: Mar. 30, 1971

[21] Appl. No.: 129,416

Related U.S. Application Data

[62] Division of Ser. No. 456,752, May 18, 1965, abandoned.

[52] U.S. Cl. .................. 148/187, 117/212, 313/108

[51] Int. Cl. .............................................. H01l 7/44

[58] Field of Search ............ 148/179, 187; 117/212; 313/108

[56] References Cited

UNITED STATES PATENTS

| | | | |
|---|---|---|---|
| 3,144,366 | 8/1964 | Rideout et al. | 148/179 |
| 3,386,857 | 6/1968 | Steinmaier | 117/212 |
| 3,404,304 | 10/1968 | Bonin et al. | 313/108 |
| 3,255,056 | 6/1966 | Flatley et al. | 148/187 |
| 3,341,380 | 9/1967 | Mets et al. | 148/187 |
| 3,345,222 | 10/1967 | Nomura et al. | 148/187 X |
| 3,388,000 | 6/1968 | Waters et al. | 117/212 |
| 3,390,025 | 6/1968 | Strieter | 148/187 |
| 3,406,049 | 10/1968 | Marinace | 148/187 X |

*Primary Examiner*—L. Dewayne Rutledge
*Assistant Examiner*—J. M. Davis
*Attorney, Agent, or Firm*—Thomas J. Kilgannon, Jr.

[57] ABSTRACT

The electroluminescent diode is formed of a body of gallium arsenide. The gallium arsenide is N-type as prepared and a junction is formed in the gallium arsenide by diffusing zinc through one major surface of the body. Prior to the diffusion step this entire surface, with the exception of a centrally located area, is covered with a layer of $SiO_2$ having a thickness such that it is semipermeable to diffusion by zinc. The diffusion through this mask produces a P-N junction 0.0001 inch away from the surface of the semiconductor body. The diffusion is much deeper (0.001 inch) through the unmasked centrally located area. It is through this latter area that an ohmic contact is made through the zinc doped gallium arsenide region. The other contact for the diode is made to the opposite surface of the device. The thickness of the $SiO_2$ is controlled, relative to the frequency of the light produced when the junction is forward biased, so that it conducts light from the surface adjacent to the junction without undue reflection.

13 Claims, 9 Drawing Figures

PATENTED APR 9 1974

3,802,969

INVENTOR.
JOHN C. MARINACE

BY Thomas J. Kilgannon Jr.
ATTORNEY

SEMICONDUCTOR DEVICES AND FABRICATING TECHNIQUES

This application is a division of co-pending application Ser. No. 456,752, filed May 18, 1965, now abandoned.

This invention relates to semiconductor devices and to techniques for fabricating semiconductor devices. The invention is particularly directed to electroluminescent techniques and devices.

Certain semiconductor devices, including electroluminescent devices, have been found to provide enhanced operational capabilities when one conductivity-type region is non-uniform in thickness. For example, the light formed at the junction of an electroluminescent diode is attenuated by the semiconductor material forming the diode, so it is advantageous to use extremely thin layers of material to reduce attenuation. However, the requisite ohmic contacts are more readily made in relatively thick regions. Hence, it is desirable to form these semiconductor devices with at least one conductivity-type region that is diffused to a non-uniform thickness.

Regions of non-uniform thickness have been produced during stages in the fabrication of semiconductor devices, as shown in U.S. Pat. No. 2,898,247 which issued to L. P. Hunter on Aug. 4, 1959. However, the finally fabricated device does not contain a diffused region of non-uniform thickness to which an ohmic contact is made.

A fabrication technique for producing the above-described device has also been invented. According to this procedure, a semi-conductor material is non-uniformly masked with a semi-permeable material through which the impurity is then diffused. In this manner, the depth of the diffused region is non-uniform because greater depths of diffusion are developed in areas where the permeability of the mask is greater (where the semi-permeable mask is relatively thin). The inventive process is preferably practised by successively applying two semi-permeable masking layers of the same material, but with predetermined overlapping patterns. For example, the first masking layer can consist of a coating of semi-permeable material which covers the surface of the semiconductor material except for a narrow slot where the layer is omitted. The second masking layer can then be applied to all regions except for another narrow slot which intersects the first slot. The resulting masking layer is relatively thick (two layers) except for an "X"-shaped region which contains only a single masking layer. The masking layer is completely absent at the intersection of the slots. An impurity is then diffused through the masking layers to produce a relatively thick region at the intersection of the slots while the remaining portions are suitably thin to provide minimum attenuation to light developed at the junction. An ohmic contact is then made at the thick region. Impurity concentrations of non-uniform depth can also be developed by masking the semiconductor material with different semi-permeable materials before diffusing the impurity. The relative thicknesses and permeabilities of the materials, and their patterns, control the depth of diffusion throughout the semiconductor material.

It is thus a primary object of the present invention to provide a semiconductor device and, in particular, an electroluminescent device, wherein at least one conductivity-type region is diffused to a non-uniform thickness.

Another object is to provide a process for fabricating semi-conductor devices and, in particular, electroluminescent devices where an ohmically-contacted region of non-uniform thickness is diffused into a semiconductor material.

Another object is to provide a process for developing a region of non-uniform thickness in a semiconductor material by diffusing an impurity through a non-uniform, semi-permeable masking layer, and to provide a device that is fabricated in accordance with this process.

Another object is to provide a process for developing a region of non-uniform thickness in a semiconductor material by diffusing an impurity through successive semi-permeable masking layers, where one masking layer defines a pattern that overlaps the pattern defined by another layer, and to provide a device that is fabricated in accordance with this process.

A further object is to provide a process for developing a region of non-uniform thickness in a semiconductor material by diffusing an impurity through a semi-permeable mask having optical properties such that light which is electroluminescently developed in the semiconductor material is transmitted by the mask, and to provide a device that is fabricated in accordance with this process.

The foregoing and other objects, features and advantages of the invention will be apparent from the following more particular description of preferred embodiments of the invention, as illustrated in the accompanying drawings.

Figures 1A, 1B, 1C, 1D, 2A, 2B, 2C, 2D, 2E:
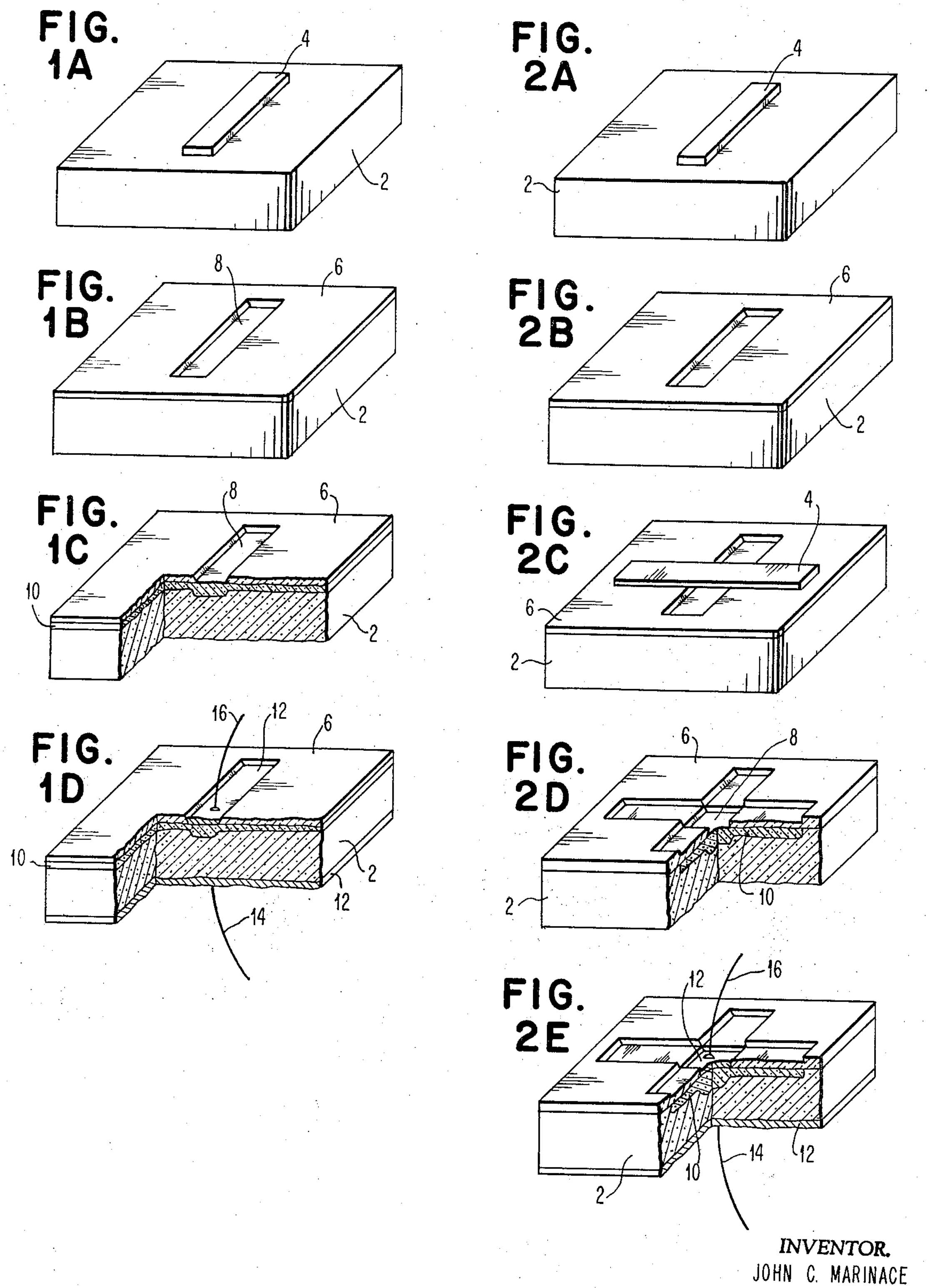
FIGS. 1A-1D are diagrams showing sequential steps in a preferred embodiment of the inventive process and showing a preferred embodiment of the resulting inventive structure.
FIGS. 2A-2C are diagrams showing sequential steps in a second embodiment of the inventive process, and showing a second embodiment of the resulting inventive structure.

A chip of semiconductor material 2, such as n-type gallium arsenide (GaAs), is used as the substrate in the embodiments. As shown in FIGS. 1A and 2A, a mask 4, such as a metal, is placed adjacent to the semiconductor material. A semi-permeable masking layer 6 (FIGS. 1B, 2B) such as silicon oxide ($SiO_2$), is then coated upon the semiconductor material 2, except for the area 8 which is covered by mask 4. The mask 4 is then removed.

The embodiments differ in the succeeding steps of the process. In the preferred embodiment, an acceptor, such as zinc (Zn), is diffused through the masking layer 6 and region 8 to produce a p-type region 10 (FIG. 1C) in the semiconductor material. Since the semi-permeable masking layer 6 impedes diffusion, the p-type region below this layer is thnner than the region below area 8. The deep diffusion below area 8 results in a region of extremely high impurity concentration ($p+$) near the surface of the semiconductor material. Obviously, region 8 need not be elongated, but rather a small "window" of any shape can be used. Alternatively, several regions 8 can be developed throughout the device by employing several masks 4. In this case, the resulting structure can be divided to form several devices. The opposite surface of the semiconductor material and the region 8 are then plated with a metal alloy 12 (FIG. 1D) such as (Au:Sn:In), and wires 14 and 16 are affixed to the platings.

Thus, the resulting structure contains a diffused *p*-type region of a non-uniform thickness permitting ohmic contact to a relatively thick (*p*+) region while retaining a relatively thin (*p*) region in other areas with enhanced electroluminescent properties. Although the transparent masking layer can be removed, it is preferably retained especially when deposited to a preferred thickness which is a function of the frequency of the electroluminescently-generated light to maximize the amount of light exiting from the structure.

In the second embodiment of the invention, two successive masking layers are applied with intersecting patterns. In FIG. 2C, the mask 4 is rotated by 90° and a second coating of the semi-permeable material 6 is applied, resulting in the structure shown in FIG. 2D. The masking layer 6 is omitted entirely in area 8 (at the intersection of the patterns) and is present at double thickness at the corners of the device. The impurity is then diffused through the semi-permeable material 2 to form a *p*-type region 10 with the shape of an "X" and a (*p*+) region below area 8. The double coating 6 in the corners is of sufficient thickness to substantially block all diffusion. Alternatively, the use of thinner coatings 6 provides a *p*-type region over the entire device, where the region is thinnest at the corners, somewhat thicker in the "X" shaped area and thickest (*p*+) in the center. The opposite side of the semiconductor material is then plated with a metal 12 and connectors 17 and 16 are affixed.

Since the mask 4 does not extend beyond the edges of the semiconductor material, the junction is passivated. That is, the degradation of the junction by contamination by the ambient atmosphere is minimized.

In both embodiments, the non-uniform layer 6 can be applied without masks 4 by uniformly coating the semiconductor material one or more times with masking layers and etching patterns on each layer.

While the processes can be practised with broad tolerances, excellent results have been obtained by using the following materials and parameters:

$SiO_2$ masking layer 6 is vacuum deposited from SiO source in back pressure of about 50 u $O_2$ to a thickness of about 2,300A in the regions where light is to be emitted. (The index of refraction of the masking layer should approximate the square root of the index of refraction of the semiconductor material, and the thickness of the masking layer should approximate an odd multiple of one quarter of the wavelength of the light to be emitted. Since the room temperature wavelength is about 9,000A for the specified materials, a masking layer thickness of about 2,300A is prescribed.)

Semiconductor material of *n*-type GaAs doped with Si, Te, Se or Sn in the range of $10^{17}$ atoms/cm$^3$.

Zn impurity is diffused at about 850°C for about two hours to a depth of 0.001 inch in the region where the semi-permeable masking layer is absent and to a depth of about 0.0001 inch where a single thickness of semi-permeable material is present, at a concentration of about $2 \times 10^{18}$.

Metal 12, 14 is electrolessly-plated in several cm$^3$ of about one gram of gold chloride $HAuCl_4 \cdot 3H_2O$ in 700 ml. of water plus 100 ml. of hydrofluoric acid (HF) to provide about a 5,000A plating of gold; then, electroplated with about 5,000A of tin (Sn) from a tin fluoroborate bath $Sn(BF_4)_4$; then fired at about 450°C for about 10 seconds; then electroplated with about 0.0005 inch of indium (In) from a flurobórate $IN(BF_4)_3$ solution.

Thus, the present invention includes processes for diffusing an impurity to a non-uniform depth to provide structures which have enhanced electroluminescent properties. All of the processes described make use of a semi-permeable masking layer to control the depth of diffusion, and further modification of this basic process can obviously be made to produce devices having any desired diffusion pattern or diffusion depth without departing from the spirit and scope of the invention.

What is claimed is:

1. A process of fabricating a semiconductor device comprising the steps of:

masking at least a portion of a semiconductor material with a non-uniform, semi-permeable masking layer;

and diffusing an impurity through the masking layer.

2. The process described in claim 1, wherein the masking layer comprises silicon oxide and the impurity comprises zinc.

3. The process described in claim 1, wherein the region in which the impurity is diffused is of *p*-conductivity type.

4. The process described in claim 1, wherein the impurity concentration is above the level of degeneracy in a portion of the semiconductor material.

5. A process of fabricating a semiconductor device comprising the steps of:

masking at least a portion of a semiconductor material of a first conductivity type with a non-uniform, semi-permeable masking layer;

and diffusing an impurity through the masking layer to form a region of second conductivity type which has a non-uniform thickness.

6. The process described in claim 5, wherein the masking layer comprises silicon oxide and the impurity comprises zinc.

7. The process described in claim 5, further comprising the steps of affixing an ohmic connection to each conductivity-type region.

8. A process of fabricating a semiconductor device comprising the steps of:

masking a semiconductor material with a predetermined pattern;

applying a semi-permeable masking to the unmasked regions of the semiconductor material;

removing the mask;

and diffusing an impurity through the semi-permeable masking.

9. The process described in claim 8, wherein the semi-permeable masking comprising silicon oxide with a thickness that is dependent upon the frequency of the light to be emitted by the device, and the impurity comprises zinc.

10. A process of fabricating a semiconductor device comprising the steps of:

masking a semiconductor material with a first predetermined pattern;

applying a semi-permeable masking layer to the unmasked regions of the semiconductor material;

masking the semiconductor material with another predetermined pattern which overlaps the first predetermined pattern;

applying a semi-permeable masking lyaer to the unmasked region diffusing an impurity through the semi-permeable masking layers;

and affixing ohmic connectors to the device.

11. The process described in claim 10, wherein the masking layer comprises silicon oxide with a thickness that is dependent upon the frequency of the light to be emitted by the device, and the impurity comprises zinc.

12. The process described in claim 10, wherein an ohmic connector is affixed at a region of overlap between the masking patterns.

13. The process described in claim 10, wherein the the masking layer has a thickness that is dependent upon the frequency of light to be emitted by the device.

* * * * *